United States Patent [19]

Dawson et al.

[11] 4,160,258

[45] Jul. 3, 1979

[54] OPTICALLY COUPLED LINEAR BILATERAL TRANSISTOR

[75] Inventors: Larry R. Dawson, Albuquerque, N. Mex.; Stephen Knight, Murray Hill, N.J.

[73] Assignee: Bell Telephone Laboratories, Incorporated, Murray Hill, N.J.

[21] Appl. No.: 852,728

[22] Filed: Nov. 18, 1977

[51] Int. Cl.$^2$ .......................................... H01L 29/161
[52] U.S. Cl. ........................................ 357/16; 357/30; 357/61; 357/19
[58] Field of Search .................. 357/16, 30, 61, 19

[56] References Cited

U.S. PATENT DOCUMENTS

| | | | |
|---|---|---|---|
| 2,569,347 | 9/1951 | Shockly | 332/52 |
| 3,211,970 | 10/1965 | Christian | 317/235 |
| 3,369,132 | 2/1968 | Fang et al. | 307/299 |
| 3,413,480 | 11/1968 | Biard et al. | 250/211 |
| 3,636,358 | 1/1972 | Groschwitz | 250/211 J |
| 3,780,359 | 12/1973 | Dumke | 317/235 R |
| 3,855,607 | 12/1974 | Kressel | 357/18 |
| 4,068,252 | 1/1978 | Lebailly | 357/17 |

OTHER PUBLICATIONS

Konogai, et al., *Journal of Appl. Phys.*, vol. 46, No. 5, May 1975.
Alferov, *Sov. Phys. Semicond.*, vol. 7, No. 6, Dec. 1973, pp. 780 et seq.
Beneking, *Electronics Letters*, 12, Aug. 5, 1976, pp. 395 et seq.
Journal of Applied Physics 46, May 1975, pp. 2120 et seq.

*Primary Examiner*—Martin H. Edlow
*Attorney, Agent, or Firm*—Richard D. Laumann

[57] ABSTRACT

A symmetric double heterojunction transistor consisting of a lightly doped wide bandgap—heavily doped narrow bandgap—lightly doped wide bandgap structure with the wide bandgap materials having a conductivity type opposite to that of the narrow bandgap material is optically accessed, symmetric with respect to the polarity of applied bias across the transistor and has linear current-voltage characteristics through the origin. A preferred embodiment uses a $nGa_{1-x}Al_xAs$-$pGaAs$-$nGa_{1-x}Al_xAs$ structure.

15 Claims, 6 Drawing Figures

OPTICALLY COUPLED LINEAR BILATERAL TRANSISTOR

BACKGROUND OF THE INVENTION

1. Field of the Invention

This invention relates generally to heterojunction transistors and particularly to a symmetrical double heterojunction phototransistor.

2. Description of the Prior Art

Heterostructure transistors have been studied in considerable detail since they were originally proposed by Shockley in 1951 (U.S. Pat. No. 2,569,347), because the wide bandgap emitter opened possibilities of obtaining high injection efficiencies into a narrow bandgap base. Many material systems, including Si-Ge, Si-GeSi, GaAs-Ge, ZnSe-GaAs, ZnSe-Ge, and $Ga_{1-x}Al_xAs$-GaAs, have been investigated and used to make heterojunction devices with varying amounts of success. For example, the devices described in U.S. Pat. No. 3,211,970 will have low breakdown voltages, for reasonable base thicknesses, because the carrier concentration is less in the base than in the emitter or collector. With many of the material systems investigated, defect currents through interface recombination states limit current gains to small values. At the present time, the $Ga_{1-x}Al_xAs$-GaAs system appears most promising because junctions can be fabricated with a low density of interfacial states because of the good lattice match. U.S. Pat. No. 3,780,359 describes an $(n-Ga_{1-x}Al_xAs)$ - $(p-GaAs)$ - $(n-GaAs)$, $0.3 < x < 0.9$, heterostructure designed for high frequency use and having a DC current gain of 25. A further study of the same system reported in *Journal of Applied Physics* 46, pp. 2120–2124, May 1975, used a thinner base and achieved current gains of 350.

Interest in heterojunction devices is further increased as they are attractive for use as photodetectors because, unlike homojunction devices, materials can be chosen that are essentially transparent to the light of interest. This permits higher efficiencies as all incident photons can be absorbed where desired within the device. Devices of this type, i.e., transistors with optically accessed bases, have been made by Alferov, *Soviet Physics–Semiconductors* 7, pp. 780–782, December 1973, and Benek-ing, *Electronics Letters* 12, pp. 395–396, Aug. 5, 1976, who reported gains of 350 and 2,000, respectively.

There are many situations where it is desirable to provide electrical isolation between two electrical circuits. For example, it may be desired to insure circuits are independent of each other with respect to DC potential levels or to restrict spurious or unwanted voltages to a single part of the complete electrical system. Many devices, including relays and transformers, can provide electrical isolation. However, for some purposes, primarily relating to size, it has been found desirable to couple circuits optically.

Devices providing such optical coupling are commonly called opto-isolators. These are solid state devices consisting of a light source connected to the input circuit, commonly a light emitting diode (LED), and a photodetector connected to the output circuit. A current flowing in the input circuit causes the light source to emit and some of the light falls on the photodetector which causes the output circuit to respond. Because of their small sizes, opto-isolators are well-suited for use in solid state equipment.

Although photodetectors of the type described can be used in opto-isolators, they suffer a drawback that complicates their use in opto-isolators. For many purposes, it is more convenient to operate the photodetector with either polarity of applied voltage. The devices described will work with only one polarity of voltage across the photodetector and care must therefore be taken to insure that the voltage polarity is always correct. In many cases, such as supervisory signaling in telephone systems, this is inconvenient or impossible and a bilateral switch is desired.

SUMMARY OF THE INVENTION

In accordance with the present invention, an optically accessed double heterostructure transistor is provided whose operation is symmetric with respect to the polarity of the applied bias. The device is a symmetric structure having a lightly doped wide bandgap-heavily doped narrow bandgap-lightly doped wide bandgap configuration in which the narrow bandgap layer is of a conductivity type opposite to that of the two wide bandgap layers. The narrow bandgap layer serves as the base and, depending upon the polarity of the applied bias, one of the wide bandgap layers is the emitter and the other is the collector. In a preferred embodiment, the device has a multilayer $Ga_{1-x}Al_xAs$-$Ga_{1-y}Al_yAs$-$Ga_{1-x}Al_xAs$, $0.1 < x < 0.8$, and $x > y$, structure. The device has a linear bilateral current-voltage characteristic through the origin and is well-suited for use in opto-isolators.

DETAILED DESCRIPTION

Figure 1A:
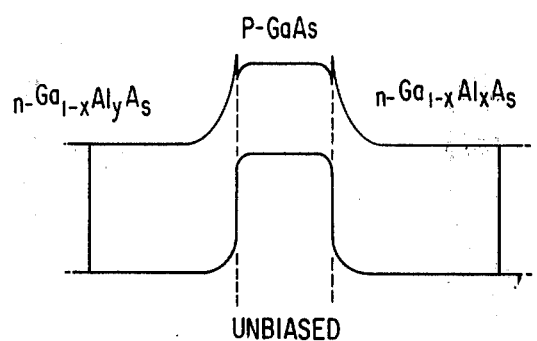
FIGS. 1(a) and 1(b) are energy band diagrams of the double heterostructure transistor when unbiased and when biased.
Figure 1B:
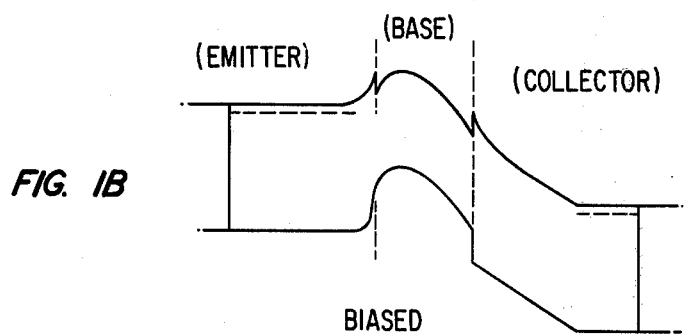

FIGS. 1(a) and 1(b) are energy band diagrams for devices of this invention. FIG. 1(a) shows the energy levels when the device is not biased and FIG. 1(b) shows the energy levels for the device when biased. The diagrams depict n-p-n devices and the invention will be described with respect to n-p-n devices although p-n-p devices can be made with obvious modifications. The devices depicted are symmetric, provided the injection efficiencies for both junctions are equal and close to unity. This is insured by having the emitter and collector bandgaps sufficiently larger than the base bandgap for good injection efficiency. The difference should be at least two Kt.

The presence of the wide bandgap emitter and collector means that a majority of the incident photons, provided their energies are less than that of the emitter or collector bandgap, will pass through either the emitter or collector and, if their energies exceed that of the base bandgap, be absorbed in the narrow bandgap base. The bandgap of the emitter and collector regions must be such that those regions are essentially transparent to the incident light. This structure differs from that of the more usual homostructure phototransistor in which most of the photons are absorbed in the vicinity of the base-collector junction although some photons are necessarily absorbed as they pass through either the emitter or collector.

The structures of this invention can be fabricated using any one of a number of well-known and conventional techniques. An exemplary technique, liquid phase epitaxy, will be described in some detail. Other methods, such as vapor phase epitaxy or molecular beam epitaxy, may also be used.

A conventional double chamber pyrolytically coated graphite slider boat is employed. The first chamber contains gallium and aluminum as solvents and tellurium as dopant. Other well-known dopants, such as sulphur, selenium, tin, and silicon, might also be used. The second chamber, used for growing the base layer, contains gallium as the solvent and germanium as dopant. Other well-known dopants, such as silicon, zinc and cadmium, might also be used. Both chambers are maintained at a nominal temperature of 900 degrees C. and saturated with arsenic from a GaAs source. The temperature selected is not crucial. Temperatures as low as 400 degrees C. or as high as the melting temperature of GaAs might also be used. Below 400 degrees C., the growth process becomes too slow for useful results. The dopant level is such that the p carrier concentration is desirably less than $10^{20}/cm^3$ and the n carrier concentration is desirably less than $10^{18}/cm^3$ and n is always less than p. The melt composition in the first chamber may be varied in well-known manner so as to grow $Ga_{1-x}Al_xAs$ with $0.15 < x < 0.8$, and similarly in the second chamber so as to grow $Ga_{1-y}Al_yAs$, $x > y$. For a typical high voltage embodiment of the device, nominal values for n and p are $10^{15}/cm^3$ and $10^{17}/cm^3$, respectively. Equal doping concentrations for the n type regions yield symmetric breakdown voltages, which is desirable for many purposes. The concentrations need not be equal, however. If the Al content becomes too low, i.e., if $x < 0.15$, the emitter efficiency becomes too small for useful results. If the Al content is too high, i.e., if $x > 0.8$, the materials tend to become hydroscopic. If x does not sufficiently exceed y, there will be poor absorption in the base or very narrow spectral sensitivity. A particularly useful embodiment has y equal to 0.0. Additionally, x should exceed y by an amount such that the bandgap difference between emitter and base exceeds several kT.

The structures may be grown on any suitable substrate that matches lattice constants and thermal expansion coefficients and is chemically compatible with the material grown, such as the (100) face of a GaAs crystal. The substrate selected is brought under the first chamber, to grow the first layer, at a nominal temperature of 900 degrees C. and the furnace temperature is lowered at a nominal rate of 1 degree C. per minute although the cooling rate may be varied in well-known manner. Alternatively, the ovens may be maintained at a constant temperature and an electric current applied. The substrate is moved to the second chamber, to grow the second layer, and then returned to the first chamber to grow the third layer. Growth is terminated at 700 degrees C. Times and temperatures within each chamber as well as cooling rates may be varied in well-known manner depending upon the dimensions desired of the layers of the structure.

The substrate is removed, if so desired, with selective chemical etching with a hydrogen peroxide-ammonium hydroxide solution having a pH between 8.4 and 8.6, and contacts such as Sn-Au or Al-Sn-Au are applied to both surfaces. The contacts to the first layer grown are typically small dots such as 5 mil diameter dots on 15 mil centers that minimize light absorption and reflection. The contact on the opposite side can be a solid area contact. Using conventional techniques, the wafer is sawed into chips.

The widths of the emitter and collector are desirably between 2 $\mu$m and 200 $\mu$m. The base width is a compromise between competing considerations. The phototransistor gain, $\beta$, is approximated by the expression $\beta = 2(L/W)^2$ where L is the minority carrier diffusion length in the base and W is the thickness of the base. The base width cannot be made arbitrarily small to maximize the gain because the base must have a width sufficient to absorb a large fraction of the incident light in the base and also to keep an adequately high breakdown voltage to prevent base punchthrough. Because of these considerations, the base width is necessarily a compromise and will vary with the materials chosen. For the GaAs base described, the minimum width now is approximately 1000 angstroms although alternative growth techniques such as molecular beam epitaxy might lower this to 10 angstroms, and the maximum base width that still yields useful gains is approximately 10 $\mu$m. Larger widths do not yield adequate gains and smaller widths have breakdown voltages too low for practical use.

Figure 2:
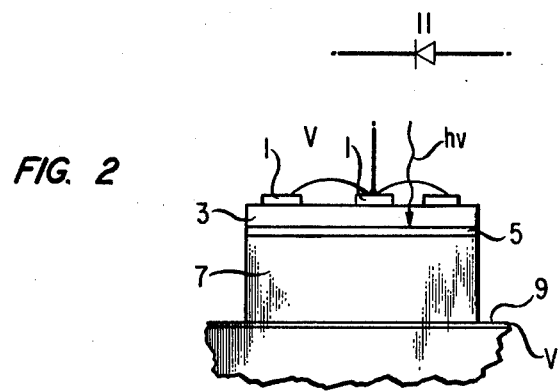
FIG. 2 illustrates the physical structure of the transistor.

FIG. 2 shows the physical structure of the symmetric transistor whose fabrication has just been described. Electrical contact 9 is a solid area contact made to region 7 which is either the emitter or collector depending upon the polarity of the applied voltage. Region 5 is the base and region 3 is either the collector or emitter. Contacts 1 are applied to region 3 and are typically dots to permit light hv from light source 11 to pass through. When the transistor is used in an opto-isolator, contacts 1 and 9 are connected to the electrical output circuit and light source 11, typically an LED, is connected to an electrical input circuit and the transistor and LED are optically coupled.

Figure 3A:
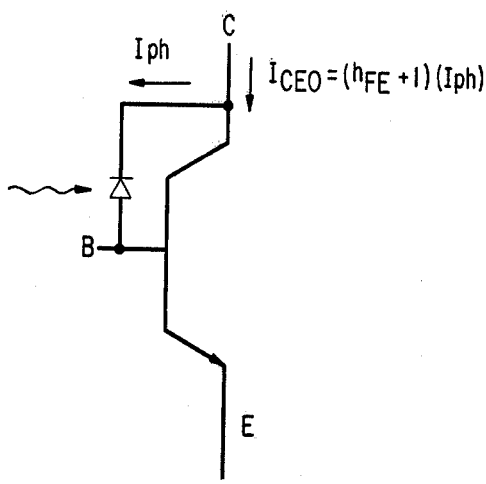
FIGS. 3(a) and 3(b) are equivalent circuits of a conventional phototransistor and of the bilateral phototransistor.
Figure 3B:
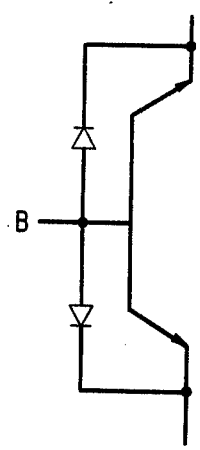

A fundamental difference between normal transistors and optically accessed transistors, i.e., phototransistors, is that normal transistors are biased ON by charge carrying electrons while phototransistors are biased ON by chargeless photons which create electron-hole pairs in the absorption process. If the base of the phototransistor is left floating, the collector current will equal the emitter current. The equivalent circuit for such a phototransistor is shown in FIG. 3(a) with $I_{ph}$ representing the photogenerated current and C, B and E the collector, base and emitter, respectively. The equivalent circuit for the symmetric structures of this invention is shown in FIG. 3(b). The equivalent circuit indicates that the current-voltage characteristics should pass through and be symmetric about the origin if the gain of the structure is the same for both polarities.

EXAMPLE

Growth was initiated at 800 degrees C. using a (100) face of a GaAs single crystal as a substrate. The furnace was cooled at a rate of 0.25 degree C. per minute. At 795 degrees C., the substrate was moved to the second chamber for 180 seconds and then returned to the first chamber. The dopants were tin and germanium, and the carrier concentrations were mid $10^{16}/cm^3$ and $10^{17}/cm^3$ for the n and p regions, respectively. Growth was terminated at 790 degrees C. The emitter and collector regions were $Ga_{0.7}Al_{0.3}As$ and the base was GaAs. Al-Sn-Au contacts were applied to both surfaces. The contacts to the first surface were 5 mil diameter dots on 15 mil centers and the contact on the opposite side, i.e., the GaAs substrate side, was a solid area contact. Conventional techniques were used to saw the wafer into chips 1.1 mm on a side. The base had a width of 0.3 μm.

The gain and current voltage characteristics were measured with the chip illuminated with a krypton laser emitting at 799.5 μm. The highest gain measured was 5917 and the minimum breakdown voltage was 2.6 volts. This value is somewhat lower than the expected value because of the relatively small collector layer thickness.

Figure 4:
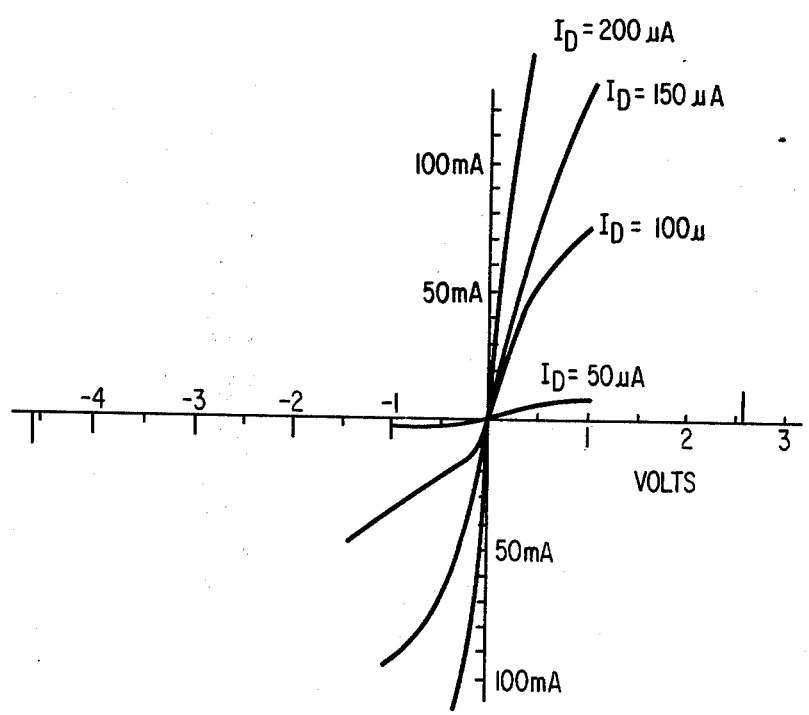
FIG. 4 depicts typical current-voltage characteristics of the bilateral phototransistor.

FIG. 4 shows the current-voltage characteristic curves for device at several injection levels. At the lowest injection levels, i.e., for currents less than a few milliamperes, symmetry is not present. Lack of symmetry at low currents is believed due to minor differences in the two heterojunctions rather than being inherent in the device. At higher injection levels, symmetry is present.

Structures fabricated as described were mounted in a conventional optical cavity of an opto-isolator package and paired with $Ga_{1-x}Al_xAs$ LEDs having a graded junction with x going from 0.3 to 0.0 and doped with silicon and whose peak emission intensity is at 0.885 μm. When tested with conventional techniques, the saturated characteristic was linear through the origin.

Examples of other material combinations that may be used in practicing the invention are GaAs-Ge, $Cd_{1-x}Mg_xTe$-ZnTe, x less than 0.5 to prevent a phase change, $InP-CdSnP_2$ or GaP-Si. In all of these combinations, the second material mentioned forms the base.

What is claimed is:

1. A heterojunction phototransistor comprising a first epitaxial layer, said first layer having a first bandgap, a first carrier concentration, and a first conductivity type; a second epitaxial layer, said second layer being disposed on said first layer and having a second bandgap, a second carrier concentration, and a second conductivity type, said second bandgap being smaller than said first bandgap; a third epitaxial layer, said third layer being disposed on said second layer and having a third bandgap, a third carrier concentration, and said first conductivity type, said third bandgap being greater than said second bandgap; said first, second and third epitaxial layers each consisting essentially of semiconducting material, at least two electrical contacts, at least one of said contacts contacting said first layer and at least one of said contacts contacting said third layer characterized in that said first carrier concentration and said third carrier concentration are less than said second carrier concentration.

2. A phototransistor as recited in claim 1 in which said first bandgap and said third bandgap are essentially equal.

3. A phototransistor as recited in claim 1 or 2 in which said first layer and said third layer consist essentially of the same material.

4. A phototransistor as recited in claim 3 in which said first conductivity type is n and said second conductivity type is p.

5. A phototransistor as recited in claim 4 in which said first layer consists of $Ga_{1-x}Al_xAs$ and said second layer consists of $Ga_{1-y}Al_yAs$, x being greater than y, x being greater than 0.0 and less than 1.0.

6. A phototransistor as recited in claim 5 in which said x is greater than 0.1 and less than 0.8, and y is essentially 0.0.

7. A phototransistor as recited in claim 5 in which said first carrier concentration is less than $10^{18}/cm^3$ and said second carrier concentration is less than $10^{20}/cm^3$.

8. A phototransistor as recited in claim 7 in which said first carrier concentration is about $10^{15}/cm^3$, said second carrier concentration is about $10^{17}/cm^3$, and said third carrier concentration is about $10^{15}/cm^3$.

9. A phototransistor as recited in claim 5 in which said second layer has a width less than 10 μm.

10. A phototransistor as recited in claim 3 in which said material of said first layer and said material of said second layer comprise a combination selected from the group consisting of GaAs-Ge; $Cd_{1-x}Mg_xTe$-ZnTe, x<0.5; $InP-CdSnP_2$, and GaP-Si.

11. An opto-isolator comprising a light source and a phototransistor, said light source and said phototransistor being optically coupled, said transistor comprising a first epitaxial layer, said first layer having a first bandgap, a first carrier concentration, and a first conductivity type; a second epitaxial layer, said second layer being disposed on said first layer and having a second bandgap, a second carrier concentration, and a second conductivity type, said second bandgap being smaller than said first bandgap; a third epitaxial layer, said third layer being disposed on said second layer and having a third bandgap, a third carrier concentration, and said first conductivity type, said third bandgap being greater than said second bandgap; said first, second and third epitaxial layers each consisting essentially of semiconducting material, at least two electrical contacts, at least one of said contacts contacting said first layer and at least one of said contacts contacting said third layer characterized in that said first carrier concentration and said third carrier concentration are less than said second carrier concentration.

12. An opto-isolator as recited in claim 11 in which said light source is an LED.

13. An opto-isolator as recited in claim 12 in which said LED is an $Ga_{1-z}Al_zAs$, z being between 0.3 and 0.0, LED.

14. An opto-isolator as recited in claim 13 in which said first layer consists of $Ga_{1-x}Al_xAs$ and said second layer consists of $Ga_{1-y}Al_yAs$, x being greater than y, x being greater than 0.0 and less than 1.0.

15. An opto-isolator as recited in claim 14 in which said x is greater than 0.1 and less than 0.8, and y is essentially 0.0.

* * * * *

UNITED STATES PATENT AND TRADEMARK OFFICE
CERTIFICATE OF CORRECTION

PATENT NO. : 4,160,258
DATED : July 3, 1979
INVENTOR(S) : Larry R. Dawson and Stephen Knight It is certified that error appears in the above-identified patent and that said Letters Patent are hereby corrected as shown below:

Column 4, line 35, "hv" should read --h$\nu$--.

Signed and Sealed this

Thirteenth Day of November 1979

[SEAL]

Attest:

RUTH C. MASON
Attesting Officer

LUTRELLE F. PARKER
Acting Commissioner of Patents and Trademarks